United States Patent [19]
Jeng

[11] Patent Number: 5,721,154
[45] Date of Patent: Feb. 24, 1998

[54] METHOD FOR FABRICATING A FOUR FIN CAPACITOR STRUCTURE

[75] Inventor: Erik S. Jeng, Taipei, Taiwan

[73] Assignee: Vanguard International Semiconductor, Hsinchu, Taiwan

[21] Appl. No.: 665,602

[22] Filed: Jun. 18, 1996

[51] Int. Cl.$^6$ .................................................. H01L 21/70
[52] U.S. Cl. .................... 437/60; 437/47; 437/52; 437/919; 148/DIG. 14
[58] Field of Search ..................... 437/47, 52, 60, 437/919; 148/DIG. 14

[56] References Cited

U.S. PATENT DOCUMENTS

| | | | |
|---|---|---|---|
| 5,364,809 | 11/1994 | Kwon et al. | 437/919 |
| 5,492,850 | 2/1996 | Ryou | 437/60 |
| 5,508,222 | 4/1996 | Sakao | 437/60 |
| 5,550,076 | 8/1996 | Chen | 437/919 |

*Primary Examiner*—Tuan H. Nguyen
*Attorney, Agent, or Firm*—Meltzer, Lippe, Goldstein et al.

[57] ABSTRACT

A unique DRAM structure has increased capacitance by using a four parallel fin capacitor structure. A preferred method for fabricating the DRAM is disclosed. DRAM cell is formed on a silicon substrate having a first conductivity type. Field oxide (FOX) regions are defined in the substrate to separate DRAM cells. Drain and source regions are formed in the substrate by forming in the substrate regions. On the substrate surface and between the drain and source, a gate region is formed. The gate region comprises a gate oxide, a Poly-1 layer, a tungsten silicide (WSi) layer, an oxide layer, and a $SiO_2$ or SiN layer. $SiO_2$ or SiN spacers cover the sides of the gate regions. Above the gate region is an insulating layer of TEOS (tetraethylorthosilicate) or BPSG (borophosphosilicate). A Poly-2 layer having a second conductivity type opposite the first conductivity type contacts the source and drain regions. The Poly-2 layer forms a bitline where it contacts the source region. Layers of WSi, thermal oxide or thin TEOS, and $Si_xN_x$, such as $Si_3N_4$, cover the bitline. The sides of the bitline are covered with $Si_xN_x$ spacers. A four parallel fin capacitor contacts the Poly-2 layer contacting the drain region. The capacitor comprises a Poly-3.1 layer and a Poly 3.2 layer both doped to the second conductivity type, a thin dielectric layer, such as nitride film/oxide film (NO) or oxide film/nitride film/oxide film (ONO), and a Poly-4 layer doped to the second conductivity type.

9 Claims, 5 Drawing Sheets

METHOD FOR FABRICATING A FOUR FIN CAPACITOR STRUCTURE

BACKGROUND OF THE INVENTION

1. Field of the Invention

The present invention relates to a unique dynamic random access memory (DRAM) device structure and method of manufacturing it and, more particularly, to a four vertical fin capacitor structure for DRAMs and methods of manufacturing these structures.

2. Related Application

A concurrently filed patent application entitled "Method for Fabricating A Vertical Fin Capacitor Structures", Serial No. 08/665,601 contains information related to this patent application. The contents of that patent application are incorporated herein by reference.

Discussion of Related Art

A DRAM memory typically comprises a transistor and a capacitor. Binary information (e.g., a 0 or 1) is stored in the capacitor in the form of an electric charge. Capacitors do not store electric charges perfectly and lose their charge if not refreshed on a regular basis, such as every 2 ms. The capacitors, however, allow information (in the form of electrical charges) to be quickly stored and accessed.

FIG. 1 illustrates a typical DRAM cell 100. The DRAM cell 100 of FIG. 1 comprises a metal oxide semiconductor field effect transistor (MOSFET) 102, and a capacitor 104. A word line is connected to the gate G of the MOSFET 102. A bitline is connected to the source S of the MOSFET 102. The capacitor 104 is connected to the drain D of the MOSFET.

The state of the DRAM cell 100 is determined by whether or not the capacitor 104 is holding an electrical charge. The DRAM cell is addressed (i.e., activated) by the word line. When the DRAM cell is activated, it may be read or written into. The DRAM cell 100 is read by using the bitline to determine whether a voltage appears at the source S, indicating the presence or absence of a charge stored in the capacitor 104. The DRAM cell is written into by using the bitline to add or remove charge from the capacitor 104.

As DRAM technology advances, the chip area used for one DRAM cell is becoming smaller. This permits more DRAM cells per unit area, resulting in a memory array storing more information in the same area as was possible in previous memory arrays. As the chip area decreases, however, the traditional T-shaped capacitors or solid node capacitors become too small to have sufficient capacitance. It becomes increasingly difficult to fabricate a capacitor having sufficient capacitance to store a charge for a sufficient time.

Two methods may be used to increase the capacitance of a DRAM cell capacitor. One method is to decrease the effective dielectric thickness of the capacitor; the other method is to increase the effective capacitor surface area. It is expected that future DRAM cells will rely heavily on the quality and storage capacity of ultra thin dielectric materials that are sandwiched between two heavily doped polysilicon and/or silicon electrodes. However, higher capacitance values cannot be obtained by using very thin dielectric material without seriously degrading the device retention time (that is, the time between refreshes). This is because films thinner than 50 Ångstroms present excessive leakage current due to direct carrier tunneling. Therefore, in order to design smaller DRAM cells, it is desirable to increase the surface area of the DRAM cell capacitor to result in a capacitance capable of storing a charge for a sufficient time. Designing such a DRAM cell is challenging because of the conflicting design characteristics: the overall cell size is preferably minimized while the capacitor surface area is preferably maximized.

It is an object of the present invention to provide a DRAM having increased capacitance by increasing the surface area of the capacitor.

It is another object of the present invention to provide a DRAM having a four vertical fin capacitor structures.

SUMMARY OF THE INVENTION

These and other objects of the present invention are achieved by a unique DRAM having a four parallel fin capacitor structure and efficient methods for fabricating the DRAM.

A preferred embodiment of the inventive DRAM cell is formed on a silicon substrate having a first conductivity type. Field oxide (FOX) regions are defined in the substrate to separate DRAM cells. Drain and source regions are formed in the substrate. On the substrate surface and between the drain and source, a gate region is formed. The gate region comprises a gate oxide, a Poly-1, a tungsten silicide (WSi) layer, an oxide layer, and a $SiO_2$ or SiN layer. $SiO_2$ or SiN spacers cover the sides of the gate regions. Above the gate region is an insulating layer of TEOS (tetraethylorthosilicate) or BPSG (borophosphosilicate). A Poly-2 layer having a second conductivity type opposite the first conductivity type contacts the source and drain regions. The Poly-2 layer forms a bitline where it contacts the source region. Layers of WSi, thermal oxide or thin TEOS, and $Si_yN_x$, such as $Si_3N_4$, cover the bitline. The sides of the bitline are covered with $Si_yN_x$ spacers.

A four parallel fin capacitor contacts the Poly-2 layer contacting the drain region. The capacitor comprises a Poly-3.1 layer and a Poly 3.2 layer both doped to the second conductivity type, a thin dielectric layer, such as nitride film/oxide film (NO) or oxide film/nitride film/oxide film (ONO), and a Poly-4 layer doped to the second conductivity type.

This preferred embodiment of the inventive DRAM is fabricated as follows:

1. FOX regions are defined in the substrate to separate adjacent cells.
2. For each cell, a gate is created using a Poly-1 layer.
3. Gate spacers are created on the sides of the gate and, using the gate and gate spacers as a mask, a conductive region is made in the exposed substrate to form the DRAM source and drain regions.
4. The cell is covered with TEOS and masked and etched to expose the source region and drain regions, leaving TEOS only over the gates adjacent to the source region.
5. A Poly-2 layer is deposited to contact the exposed drain and source regions. the Poly-2 that contacts the exposed source region forms a bitline. A thick oxide layer extends above the bitline. This thick layer is used to "build" the parallel fin capacitors. Bitline spacers are formed on the sides of the bitline.
6. A polysilicon layer (Poly-3.1 ) is deposited over the entire cell—including the exposed Poly-2 layer over the drain region and the thick oxide layer.
7. The entire cell is covered with oxide. The oxide is anisotropically etched to expose a portion of the Poly-3.1 layer and to form oxide spacers along sides of the Poly-3.1 layer. A polysilicon layer (Poly-3.2 ) is deposited over the entire cell —including the exposed Poly 3.1 layer and the oxide spacers.

8. The entire cell is again covered with oxide. The oxide is partially etched to expose a top portion of the Poly-3.1 and Poly 3.2 layers.

9. The exposed portions of the Poly-3.1 and Poly-3.2 layers are etched off. This separates the Poly-3 layer into separate capacitor electrodes.

10. The thick oxide layer and oxide fin spacers are etched off. A dielectric is deposited over the electrode and a Poly-4 is deposited over the dielectric to form the second capacitor electrode.

BRIEF DESCRIPTION OF THE DRAWINGS

The present invention is described with reference to the following figures.

DETAILED DESCRIPTION OF PREFERRED EMBODIMENT

Figure 1:
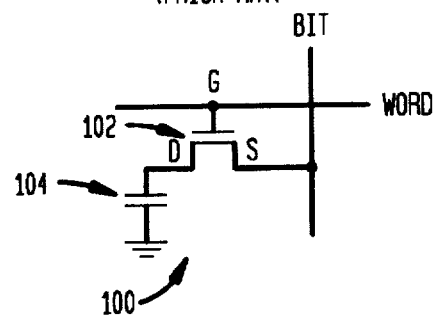
FIG. 1 is a schematic diagram illustrating a DRAM.
Figure 2:
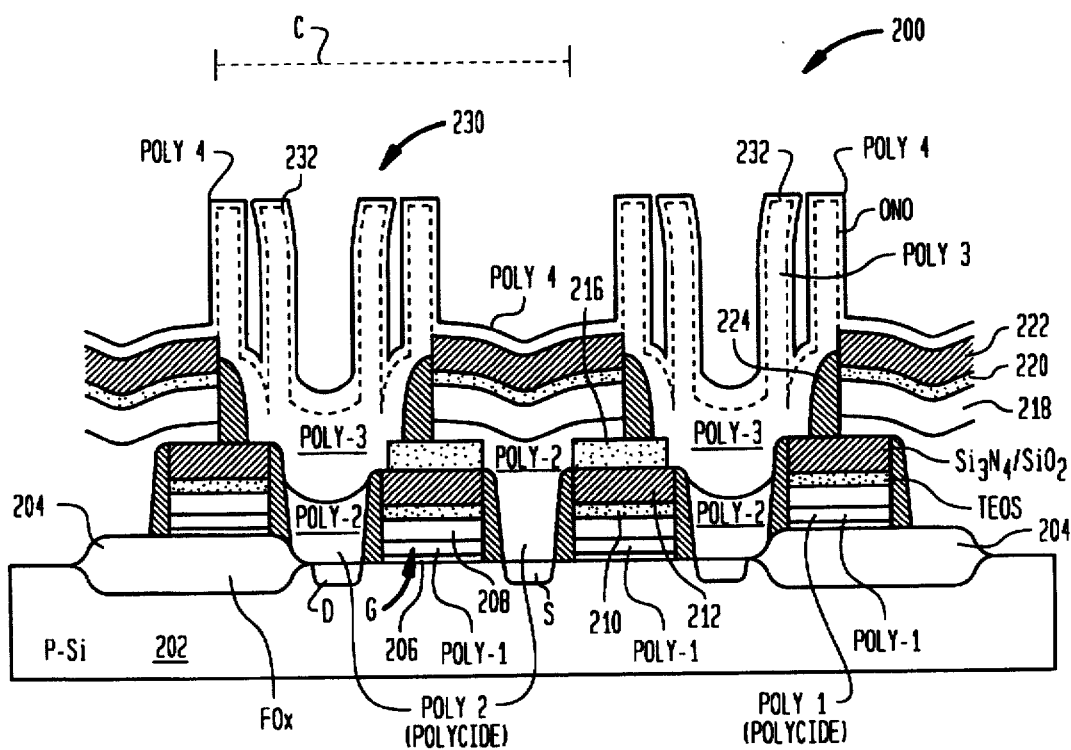
FIG. 2 is a cross-sectional view of a preferred embodiment of a DRAM according to one embodiment of the present invention.

FIG. 2 is a cross-sectional view of a first preferred embodiment of a DRAM having four parallel fin capacitors according to the present invention. FIG. 2 shows two DRAM cells sharing a single source. A dashed line C indicates a structure of a single cell. In this embodiment, the cell 200 is formed on a p-type silicon substrate 202. Field oxide (FOX) regions 204 are defined in the substrate 202 to separate DRAM cells. Drain and source regions (D,S) are formed in the substrate. On the substrate surface and between the drain and source, a gate region (G) is formed. The gate region comprises a gate oxide 206, a Poly-1 layer, a tungsten silicide (WSi) layer 208, an oxide layer 210, and a $SiO_2$ or SiN layer 212. $SiO_2$ or SiN spacers 214 cover the sides of the gate regions. Above the gate region is an insulating TEOS or BPSG layer 216. A Poly-2 layer having the second conductivity type contacts the source and drain regions. The Poly-2 layer forms a bitline where it contacts the source region. Layers of WSi 218, thermal oxide or thin TEOS 220, and $Si_yN_x$ 222, such as $Si_3N_4$, cover the bitline. The sides of the bitline are covered with $Si_yN_x$ spacers 224.

Figure 3:
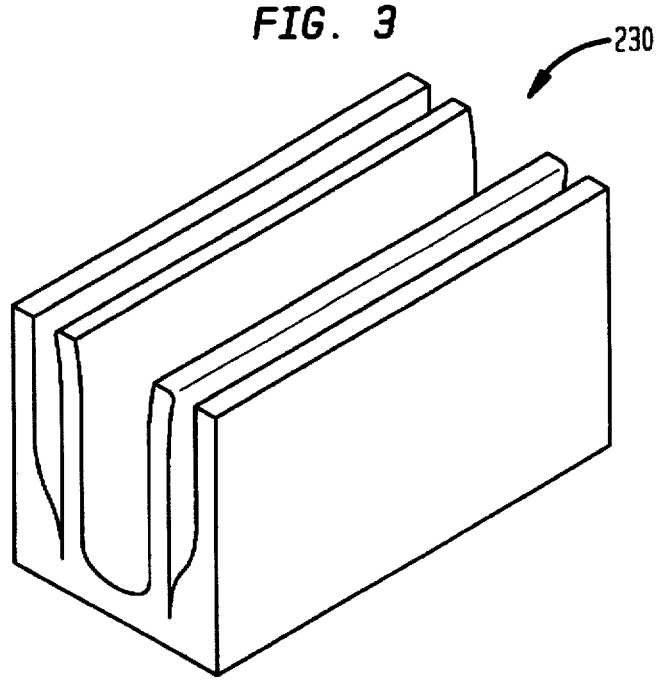
FIG. 3 an isometric view of a four parallel fin capacitor according to one embodiment of the present invention.

A capacitor 230 having a four parallel fin configuration contacts the Poly-2 layer, which contacts the drain region. The capacitor comprises a Poly-3.1 and a Poly 3.2, layer both doped to the second conductivity type, a thin dielectric layer 232, such as NO or ONO, and a Poly-4 layer doped to the second conductivity type. FIG. 3 is an isometric view of the capacitor 230 having the four parallel fin configuration.

FIGS. 4A–4G illustrate a preferred method of making the DRAM cell of FIG. 2. Note that for clarity, FIGS. 4A–4G omit some layers. The gate oxide layer, for example, is not shown.

Figure 4A:
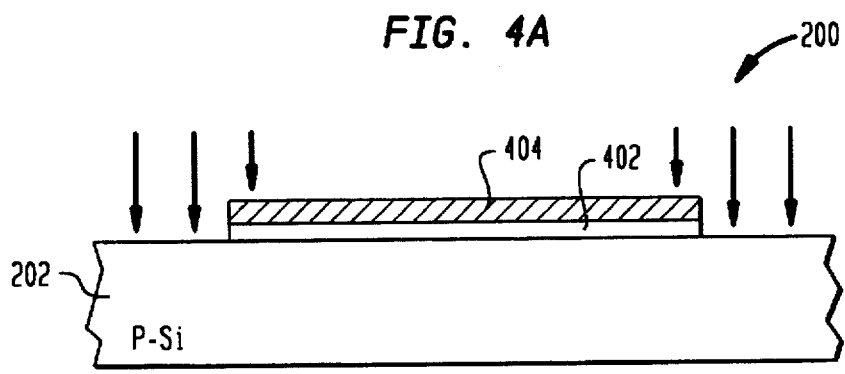
FIGS. 4A–4J illustrate a preferred method of manufacturing the DRAM of FIG. 2.

FIG. 4A shows a p-type silicon substrate 202. A person skilled in the art readily understands that an n-type substrate could also be used. If an n-type substrate is used, the conductivity types of the different conductive components have a conductivity opposite that described here.

A pad oxide film 402 having a thickness in the range of 150–350 Å is grown on the substrate 202 using the thermal oxidation method. A silicon nitride $(Si_yN_x)$ film 404 having a thickness in the range of 1,000–2,000 Å is deposited over the pad oxide film 402 using the chemical vapor deposition (CVD) method. Using photolithographic techniques, portions of the pad oxide film 402 and nitride film 404 are removed to expose the substrate in selected locations, as seen in FIG. 4A.

Figure 4B:
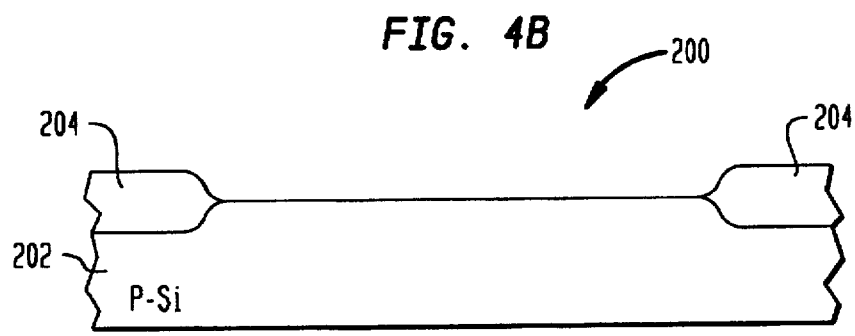

FIG. 4B shows that a field oxide region (FOX) 204 is grown at the exposed locations. The FOX is preferably grown using the thermal oxidation method. The silicon nitride film is etched away using wet etching and the pad oxide film is removed.

Figure 4C:
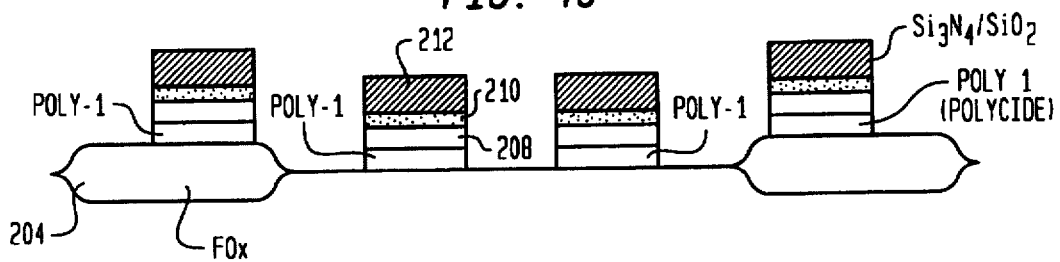

Before FIG. 4C, a layer of gate oxide film 206 having a thickness in the range of 50–150 Å is grown on the substrate using the thermal oxidation method. FIG. 4C shows a Poly-1 layer, which is preferably polysilicon, having a thickness in the range of 500–1,500 Å is deposited on the gate oxide film using the CVD method. The Poly-1 layer is preferably doped to an n-type conductivity using, for example, in-situ doping gas sources. A tungsten silicide (WSi) layer 208 having a thickness in the range of 500–1,500 Å is deposited on the Poly-1 layer using the CVD method. An oxide layer 210 having a thickness in the range of 100–500 Å is grown on top of the WSi layer 208. A layer of $Si_yN_x$ 212, such as $Si_3N_4$, having a thickness in the range of 1,000–2,000 Å is deposited on the oxide layer 210 using, for example, CVD. The oxide layer 210 is provided for stress relief because differences in thermal expansions between $Si_yN_x$ and WSi prevent the $Si_yN_x$ from being deposited directly onto WSi. These layers are masked and etched away using reactive ion etching (RIE) to form the gate region of the DRAM cell.

Figure 4D:
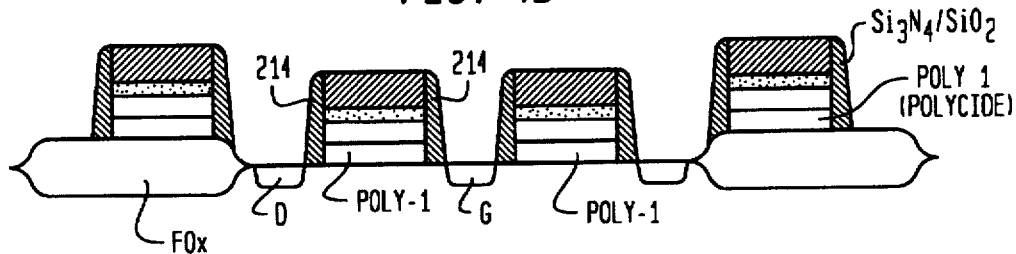

FIG. 4D shows that a second layer of $Si_yN_x$ or $SiO_2$ is deposited over the entire cell having a thickness of the range 500–1,000 Å, using the CVD method. This layer is anisotropically etched to form spacers 214 on the sides of the gate regions. Drain and source regions are formed in any well-known manner.

Figure 4E:
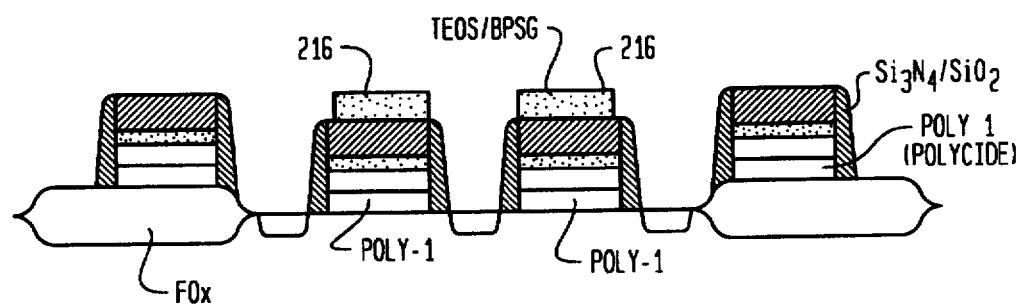

FIG. 4E shows that a layer of TEOS or BPSG (borophosphosilicate) 216, having a thickness in the range of 1,000–5,000 Å, is deposited over the entire cell using the CVD method. Using a photolithographic technique, the TEOS or BPSG is masked and etched using RIE. The remaining TEOS (or BPSG) is on top of the gate regions adjacent to the source. This exposes the drain and source regions.

Figure 4F:
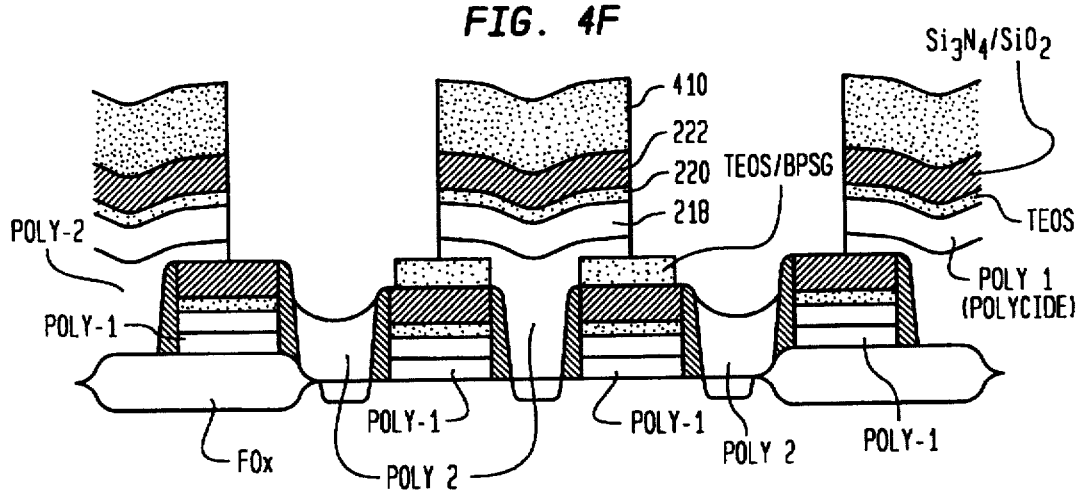

FIG. 4F shows a Poly-2 layer, which is preferably polycide, having a thickness in the range of 500–1,500 Å is deposited over the entire cell using the CVD method. The Poly-2 layer is doped with in-situ doping gas sources to make it an n-type conductivity. The Poly-2 layer contacts the exposed drain and source regions. A layer of tungsten silicide (WSi) 218 having a thickness in the range of 500–1,500 Å, is deposited on the doped Poly-2 layer using the CVD method. A thermal oxide layer, or thin TEOS layer, 220 having a thickness in the range of 100–500 Å is grown on top of the WSi layer. A layer of $Si_yN_x$, such as $Si_3N_4$, or $SiO_2$ 222 having a thickness in the range of 1,000–2,000 Å is deposited on the oxide layer 220 using, for example, CVD. A thick oxide layer 410 such as SiO, having a thickness in the range of 3,000–10,000 Å is deposited onto the $Si_yN_x$ layer 222 using the CVD method. Using photolithographic methods, the SiO, $Si_yN_x$, TEOS, and WSi layers are masked and etched, using RIE or plasma etching. The remaining layers cover the Poly-2 bitline area over the source. The remaining exposed Poly-2 is partially etched and recessed so that a concave portion of Poly-2 remains over the drain regions.

Figure 4G:
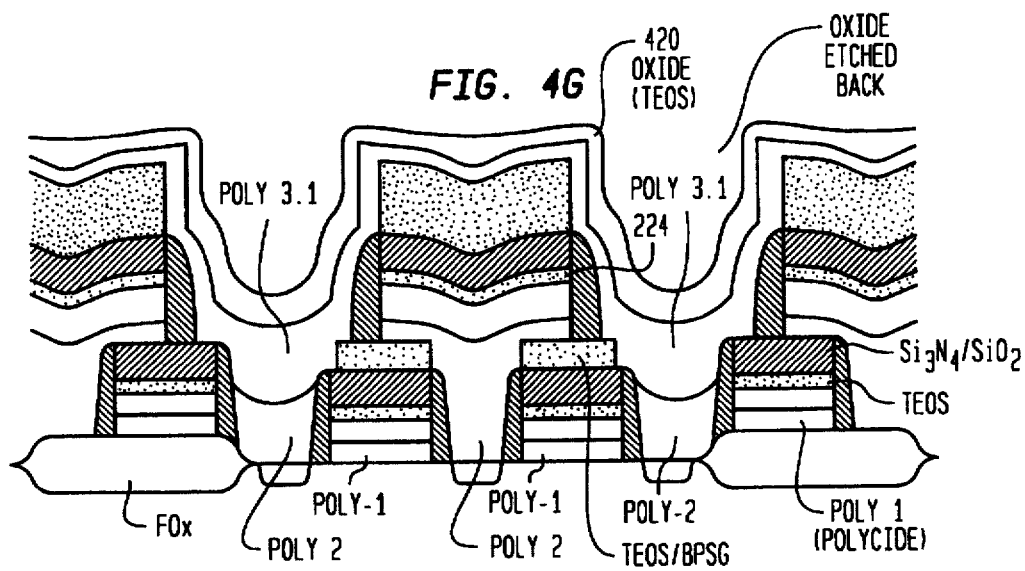

FIG. 4G shows that a second layer of $Si_xN_x$, having a thickness in the range of 300–1,000 Å, is deposited over the entire cell using the CVD method. The layer is anisotropically etched to form spacers 224 along the sides of the bitline. A Poly-3.1 layer, having a thickness in the range of 300–1,000 Å, is deposited over the cell using the CVD method. The Poly-3.1 layer is doped with in-situ doping gas sources to make it an n-type conductivity. Note that the Poly-3.1 layer contacts the Poly-2 layers contacting the drain to create a single conductive region contacting the drain region. An oxide layer 420 such as TEOS is deposited conformably using the CVD method, over the entire cell on the Poly-3.1 layer.

Figure 4H:
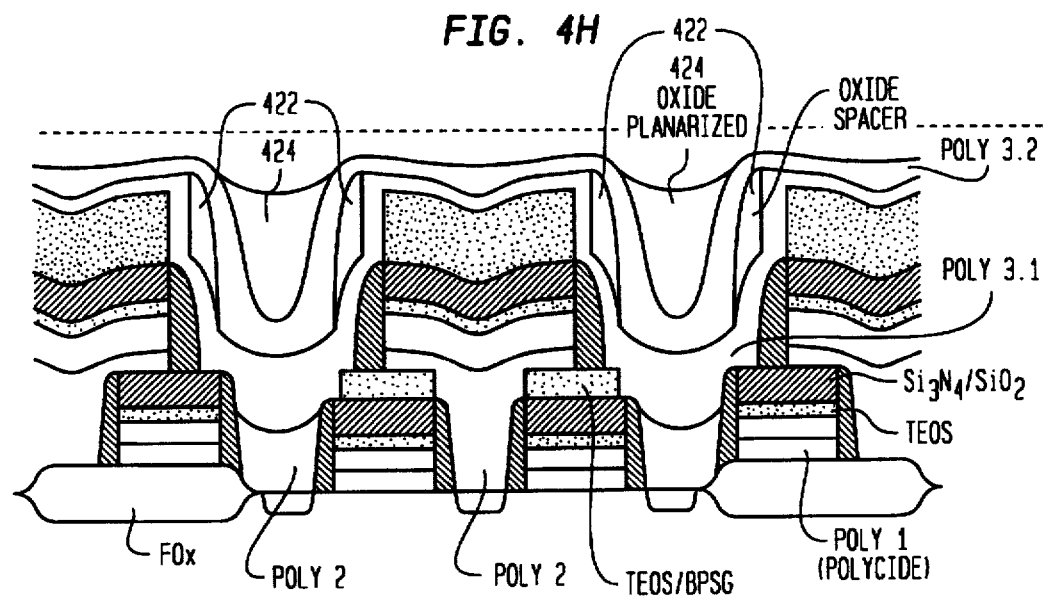

FIG. 4H shows that oxide layer 420 is anisotropically etched to form oxide fin spacers 422 on the sides of the Poly 3.1 layer, but exposing portions of the Poly 3.1 layer. A Poly 3.2 layer, having a thickness in the range of 300–1,000 Å, is deposited over the entire cell using the CVD method. This Poly-3.2 layer covers the fin spacers 422 and contacts the exposed Poly 3.1 layer. The Poly 3.2 layer is doped with in-situ doping gas sources to make it an n-type conductivity.

A second oxide layer 424 such as SOG, polyimide, photoresist, or BPSG is deposited, using the CVD or spin-coating method, over the entire cell, filling the cavities within the Poly-3 layer and up to the dashed line shown in the figure. The oxide is planarized and etched back using RIE, as shown in FIG. 4H, to expose the top of the Poly-3.1 and Poly-3.2 layers.

Figure 4I:
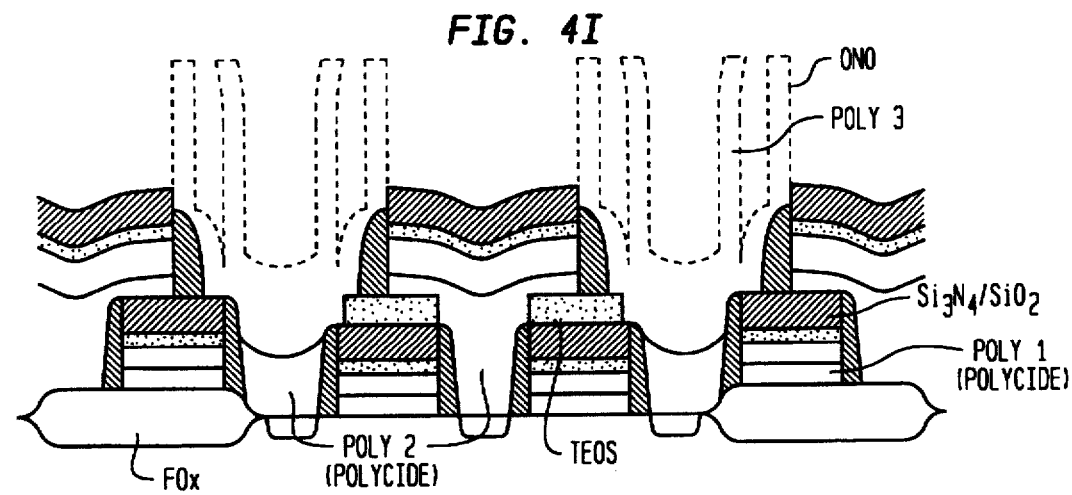

FIG. 4I shows that the exposed portions of the Poly-3.1 and Poly 3.2 layers are etched back using RIE. This etching isolates these Poly-3 layers into a number of separate capacitor electrodes. The oxide filling the cavities and forming the fin spacers 422 is removed using selective oxide or polymer to polysilicon and SiN etching. The thick oxide layer 410 is also etched away at the same time. A layer of HSG (hemisphere grain polysilicon) is deposited on the Poly-3 layer to give the capacitor electrode a non-uniform surface and thus provides additional surface area. The HSG is etched back using RIE. Using photomasks, the Poly-3 is masked and etched using RIE to separate the adjacent capacitors along the Poly-2 lines. A dielectric layer 232, such as ONO or NO, having a thickness of 40–60 Å, is deposited onto the Poly-3 layers using CVD.

Figure 4J:
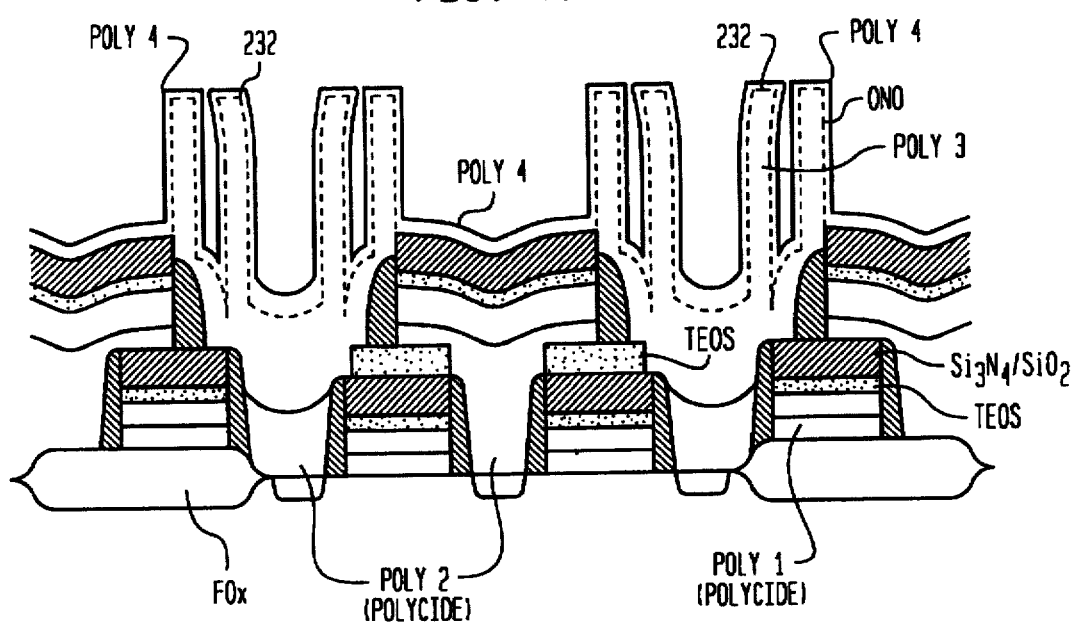

FIG. 4J shows that a Poly-4 layer, which is preferably polysilicon, having a thickness range of 1,000–2,000 Å, is deposited onto the dielectric layer 233 using CVD. This Poly-4 layer is doped to an n conductivity type by doping it with in-situ doping. Using photolithographic techniques, the Poly-4 layer is masked and etched back using RIE.

This DRAM cell manufacturing process is completed using well-known back end processes not described here.

A DRAM is disclosed having its capacitance increased by using a four parallel fin capacitor structure. A preferred method is disclosed for manufacturing a DRAM with this capacitor structure.

The above described embodiment of the invention is intended to be illustrative only. Numerous alternative embodiments may be devised by those skilled in the art without departing from the spirit and scope of the following claims.

We claim:

1. A method for manufacturing a dynamic random access memory (DRAM) device, comprising the steps of:

a. creating a gate having a first conductivity type on a substrate having a second conductivity type opposite the first conductivity type;

b. using the gate as a mask, creating in the substrate a source region and a drain region;

c. covering the device with a layer of conductive material having the first conductivity type and partially etching the conductive material, forming a bitline contacting the source and to form a concave layer contacting the drain region;

d. covering the entire device with an etchable material and etching the etchable material to form parallel lines along the bitline and to expose the conductive material contacting the drain region;

e. forming a first portion of the first capacitor electrode on the parallel lines and in contact with the conductive material contacting the drain region;

f. depositing an etchable material over the first portion;

g. anisotropically etching the etchable material, forming fin spacers on sides of the first portion and exposing other portions of the first portion;

h. forming a second portion of the first capacitor electrode contacting the fin spacers and exposed portions of the first portion;

i. depositing a dielectric over the first capacitor electrode; and j. forming a second capacitor electrode over the dielectric.

2. The method of claim 1, wherein the step of creating the gate further comprises:

a. growing a gate oxide on a surface of the substrate;

b. depositing a first polycide (Poly-1) layer on the gate oxide;

c. doping the Poly-1 layer to the first conductivity type;

d. depositing a layer of tungsten silicide (WSi) on the doped Poly-1 layer;

e. depositing an oxide layer on the WSi layer;

f. depositing a silicon nitride layer on the oxide layer; and g. etching the gate oxide, Poly-1 layer, WSi layer, oxide layer, and silicon nitride layer into a gate region.

3. The method of claim 2, wherein the step of creating the gate further comprises:

a. depositing a second silicon nitride layer on the gate region; and b. anisotropically etching the second silicon nitride layer.

4. The method of claim 1, wherein the step of covering the cell with conductive material further comprises:

a. depositing a second polycide (Poly-2) layer on the cell; and b. doping the Poly-2 layer to the first conductivity type.

5. The method of claim 1, wherein the step of forming a bitline further comprises:

a. depositing a tungsten silicide (WSi) layer on the doped Poly-2 layer;

b. growing an oxide layer on the WSi layer;

c. depositing a silicon nitride layer on the oxide layer; and d. etching the Poly-2 layer, WSi layer, oxide layer, and silicon nitride layer, forming the bitline.

6. The method of claim 1, wherein the step of forming a first portion of the first capacitor electrode comprises the steps of:

a. depositing a third polysilicon layer (Poly-3.1) on the parallel lines and in contact with the drain; and b. doping the Poly-3.1 layer to the first conductivity type.

7. The method of claim 1, wherein the step of forming a second portion of the first capacitor electrode further comprises the steps of:

a. depositing a third polysilicon layer (Poly-3.2) on the first portion of the first capacitor electrode; and b. doping the Poly-3.2 layer to the first conductivity type.

8. The method of claim 1, wherein the step of forming a second portion of the first capacitor electrode further comprises after etching the top of the (Poly-3) third polysilicon layer, depositing a layer of hemisphere grain polysilicon on the first capacitor electrode.

9. The method of claim 1, wherein the step of forming the second capacitor electrode comprises the steps of:

a. depositing a fourth polysilicon layer (Poly-4) on the dielectric layer;

b. doping the Poly-4 layer to the first conductivity type; and c. etching the doped Poly-4 layer.

* * * * *